(12) United States Patent
Inoue (10) Patent No.: US 7,318,081 B2
(45) Date of Patent: Jan. 8, 2008

(54) BAND-PASS FILTER AND TRACKING SIGNAL PROCESSOR CIRCUIT

(75) Inventor: Hidekazu Inoue, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 716 days.

(21) Appl. No.: 10/744,626

(22) Filed: Dec. 23, 2003

(65) Prior Publication Data

US 2004/0135625 A1    Jul. 15, 2004

(30) Foreign Application Priority Data

Dec. 27, 2002    (JP)    .............................. 2002-381423

(51) Int. Cl.
*G06G 7/02*    (2006.01)

(52) U.S. Cl. ...................................................... 708/819
(58) Field of Classification Search ................. 708/819
See application file for complete search history.

(56) References Cited

U.S. PATENT DOCUMENTS

| | | | | |
|---|---|---|---|---|
| 3,986,127 A | * | 10/1976 | Ray .............................. | 327/344 |
| 4,884,036 A | * | 11/1989 | Koyama et al. ............. | 327/557 |
| 2004/0229582 A1 | * | 11/2004 | Miyasita et al. ............ | 455/136 |

* cited by examiner

*Primary Examiner*—Tan V. Mai
(74) *Attorney, Agent, or Firm*—Hogan & Hartson LLP (57) ABSTRACT

A band-pass filter includes two operational amplifiers. The gm values of the operational amplifiers are each determined by a current flowing through a corresponding transistor for inducing flow of the drive current. The current flowing through the transistor is adjusted by zapping.

16 Claims, 5 Drawing Sheets

BAND-PASS FILTER AND TRACKING SIGNAL PROCESSOR CIRCUIT

BACKGROUND OF THE INVENTION

1. Field of the Invention

The present invention relates to a tracking signal processor circuit for obtaining a tracking signal for a video cassette recorder, and to a band-pass filter used in the tracking signal processor circuit.

2. Description of the Related Art

Figure 5:
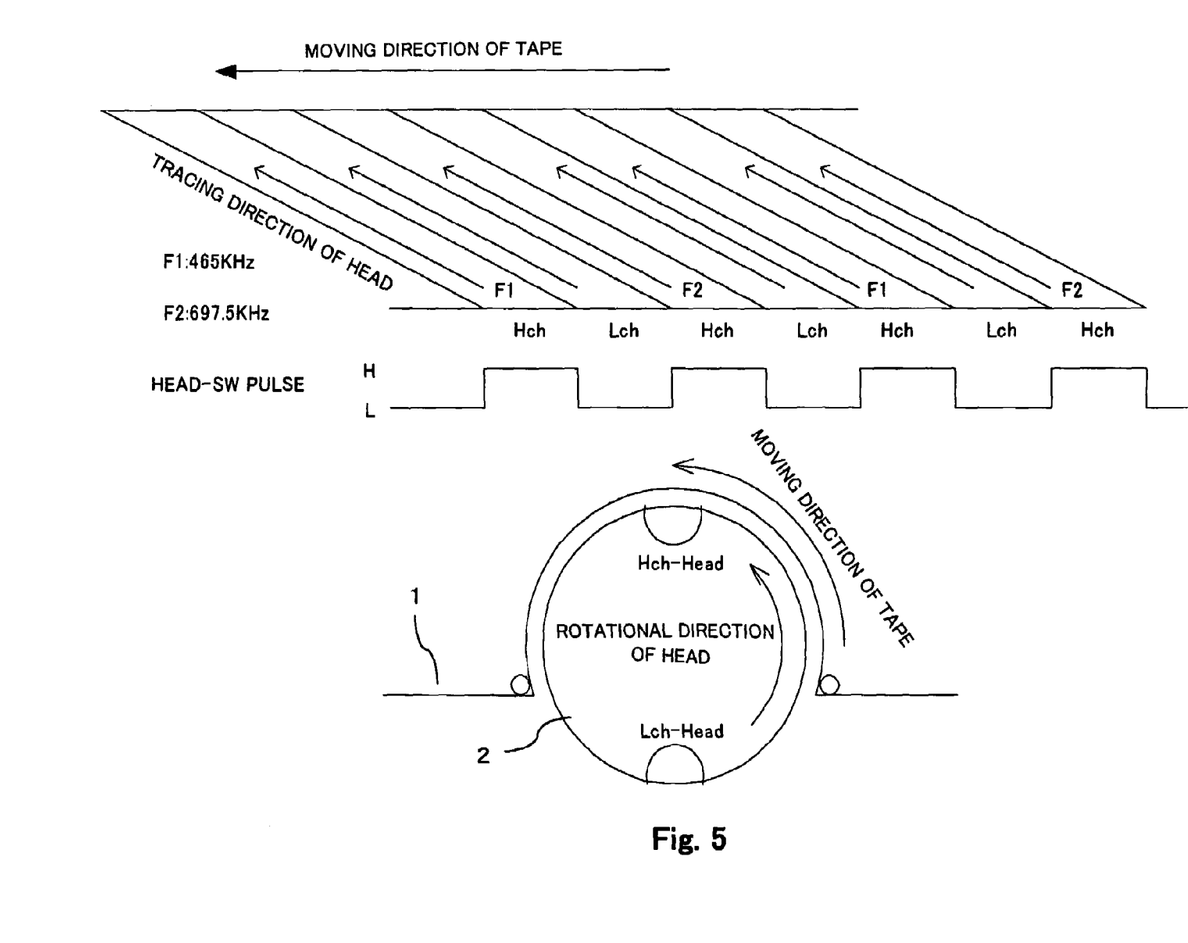
FIG. 5 is a diagram illustrating writing of pilot signals onto a magnetic tape.

FIG. 5 is an explanatory diagram illustrating a recording process performed in a digital video cam (DVC). A magnetic tape 1 moves around the periphery of a rotary head 2, and the rotary head 2 rotates in a direction which is identical with the direction of movement of the magnetic tape 1. Because the rotary head 2 rotates in a manner such that the rotary head 2 crosses the magnetic tape 1 at an oblique angle, a track oriented at a predetermined oblique angle is formed on the magnetic tape 1. Two heads Lch-Head and Hch-Head are provided on the rotary head 2, and the two heads differ in orientation angle with respect to the magnetic tape 1. These heads are switched by a head switching pulse (HEAD-SW PULSE) so that the heads write alternately.

During such a writing operation, pilot signals having two different frequencies of F1=465 kHz and F2=697.5 kHz are alternately recorded on one of the Hch-side and the Lch-side (in FIG. 5, the Hch-side is shown for the purpose of illustration).

During a replaying process, the recorded magnetic signals are traced by use of the two heads, but if the Lch-HEAD is to be used for tracing and the head position is deviated, signal components recorded on the respective sides of the signal component recorded by the Lch-HEAD, which are recorded by the Hch-HEAD, will leak and become crosstalk components.

As an operation to move the head to the correct point, tracking control of the heads is performed by detecting magnitudes of F1 and F2 signal components recorded on the sides and transmitting, to a servo microcomputer, a point at which the signal components become zero.

In an ATF circuit which serves as a tracking circuit for a DVC, signal components of 465 kHz and 697.5 kHz contained in a replay signal recorded by the two heads (Hch/Lch) on the magnetic tape (TAPE) are respectively extracted by use of band-pass filters 465K-BPF and 697.5K-BPF. The levels of the extracted signal components are compared in a comparator COMP, and the signal of the comparison result is output as the ATF output. The servo microcomputer controls the tracking such that the ATF output becomes 0.

In order to obtain a precise output from the ATF circuit, the transmission center frequencies F0 of the two band-pass filters 465K-BPF and 697.5K-BPF must be set accurately. Normally, there is provided a volume function or the like which can be externally manipulated for this adjustment. This adjustment, however, must be performed for each video camera set during the manufacturing process, and thus, there has been a problem in that this setting process requires significant labor.

SUMMARY OF THE INVENTION

According to one aspect of the present invention, there is provided a band-pass filter comprising a high-pass capacitor provided along a transmission route of an input signal; a low-pass capacitor provided between the transmission route of the input signal and a ground; and an operational amplifier for amplifying a signal, wherein a current for adjusting the gm value of the operational amplifier can be set through zapping by use of a zapping circuit. With this structure, characteristics of the band-pass filters can be easily adjusted.

According to another aspect of the present invention, the zapping circuit preferably determines the adjustment current from a current flowing through a current-determining transistor which is diode-connected. In this manner, the amount of current can be stably set.

DESCRIPTION OF PREFERRED EMBODIMENT

A preferred embodiment of the present invention (hereinafter may be simply referred to as "embodiment") will now be described with reference to the drawings.

Figure 1:
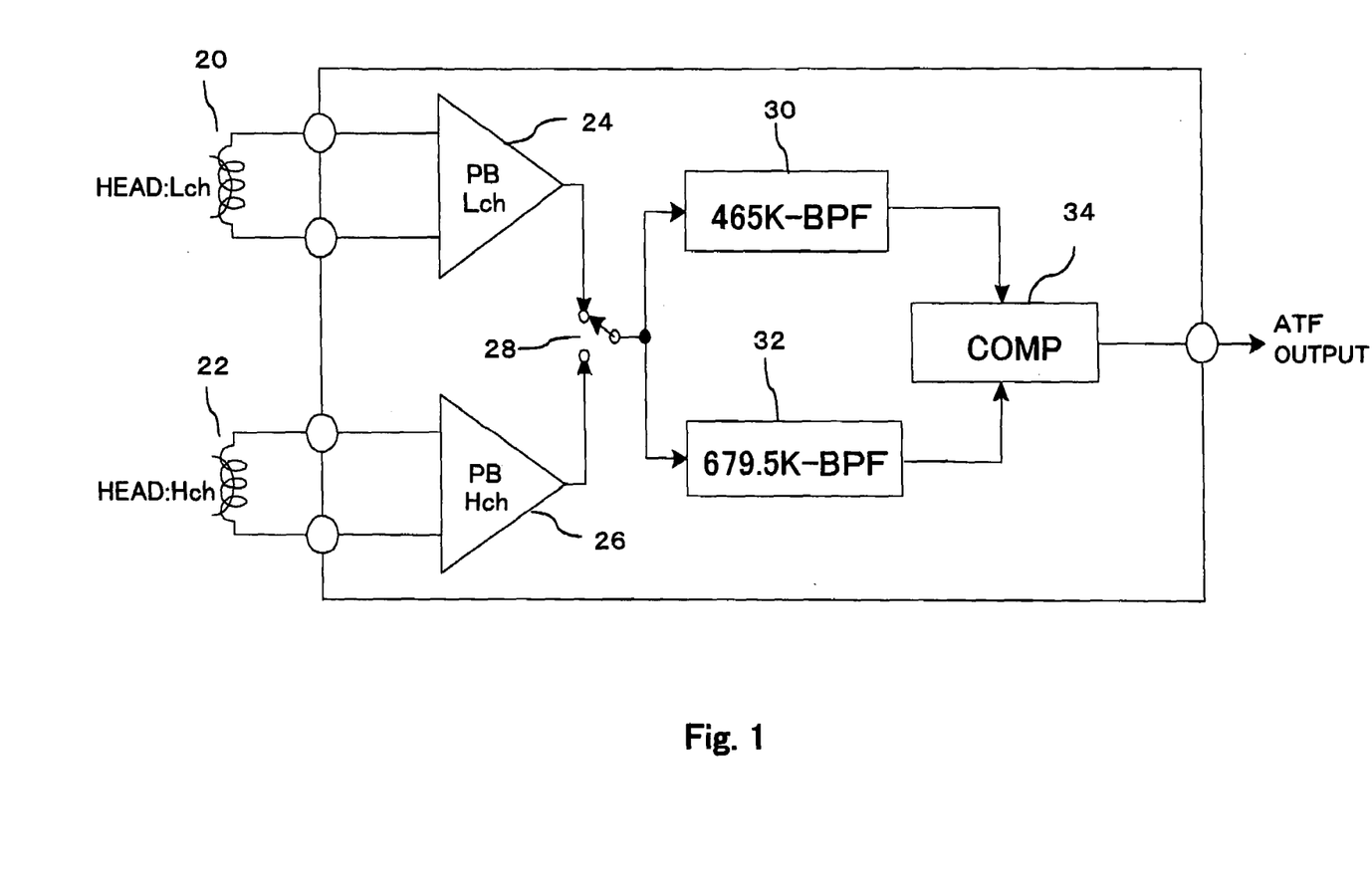
FIG. 1 is a diagram showing a structure of a tracking signal processor circuit of a preferred embodiment of the present invention.

FIG. 1 is a diagram showing a structure of a circuit for outputting an ATF signal, which is a tracking signal, according to a preferred embodiment of the present invention.

As shown in FIG. 1, replay signals extracted by two heads (Head:Lch and Head:Hch) 20 and 22 provided on a rotary head are amplified by two independent amplifiers (PB:Lch and PB:Hch) 24 and 26, respectively. The amplified signals from these amplifiers are input to band-pass filters (465K-BPF and 697.5K-BPF) 30 and 32, respectively, through a switch 28 which is switched by a head switching pulse. In this manner, two pilot signals within there play signals are respectively extracted.

Subsequently, output signals from the band-pass filters (465K-BPF and 697.5K-BPF) 30 and 32 are input to a comparator (COMP) 34, which compares the levels of the two pilot signals. In other words, the comparator (COMP) 34 detects input signals and compares DC levels of the input signals. The obtained comparison result is output as the ATF signal. The pilot signal is recorded on one of the tracks, Hch or Lch, of the magnetic disk. When a track to which no pilot signal has been recorded is replayed, the magnitudes of the two pilot signals vary depending on a deviation of the head. Therefore, the ATF signal is a signal which indicates direction and magnitude of deviation of the head. The ATF signal is supplied to a servo microcomputer, which, on the basis of the ATF signal, controls the trace position of the rotary head with respect to the magnetic tape.

In the ATF operation as described above, variations in transmission center frequencies F0 of the two band-pass filters (465K-BPF and 697.5K-BPF) 30 and 32 significantly affect the detection error. Therefore, the frequencies F0 must be adjusted for each circuit.

Figure 2:
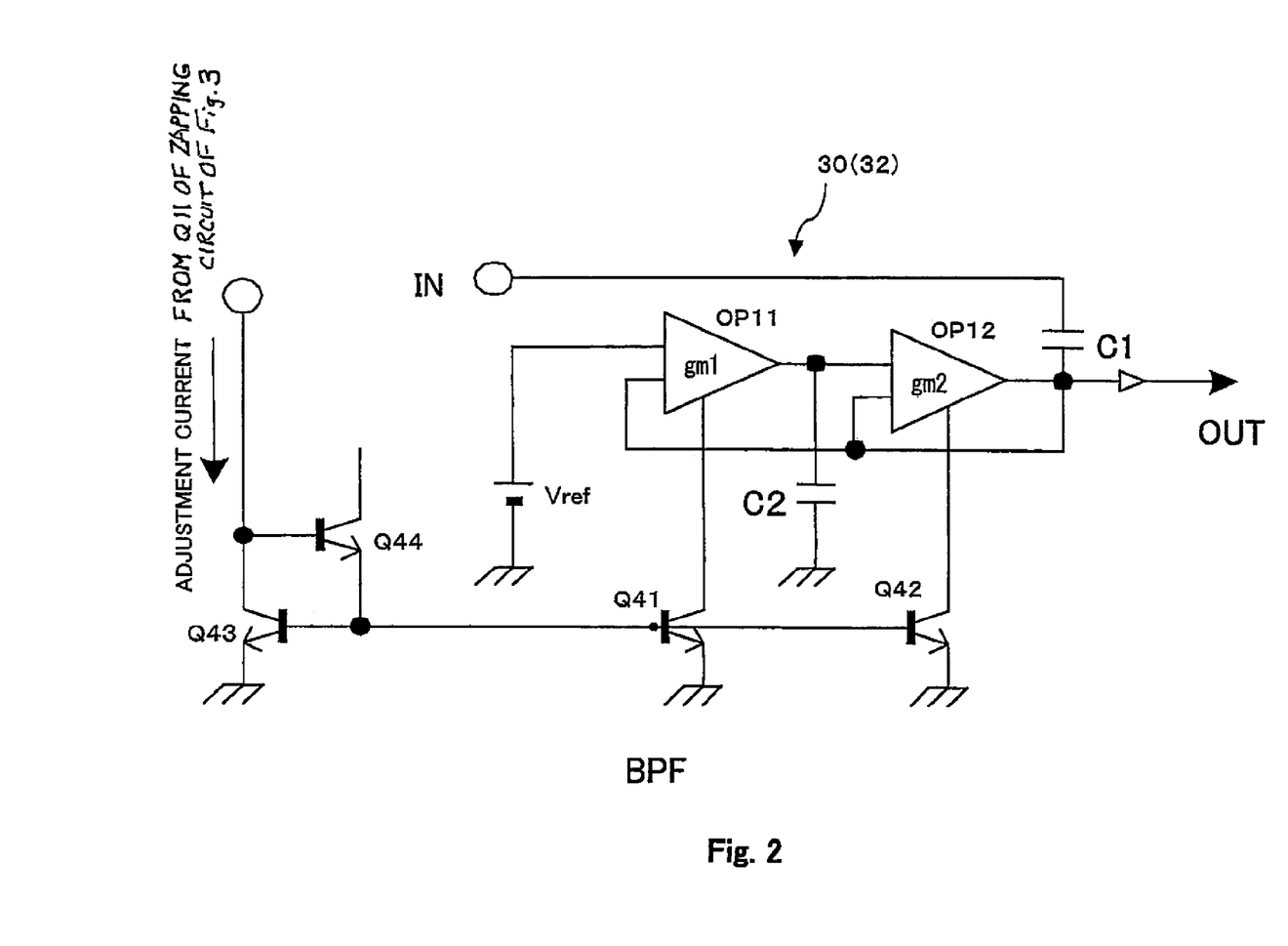
FIG. 2 is a diagram showing a structure of a band-pass filter.

FIG. 2 shows a structure of a band-pass filter (465K-BPF or 697.5K-BPF). Although the two band-pass filters may differ in the sizes of the capacitors and constants of the operational amplifiers, they have the same general structure.

A replay signal from the amplifier 24 or 26 is output via a capacitor C1. The output of the capacitor C1 is input to a negative input terminal of an operational amplifier OP11. A reference voltage Vref is input to a positive input terminal of the operational amplifier OP11, in which gm=gm1. One terminal of a capacitor C2 is connected to an output terminal of the operational amplifier OP11, and the other terminal of the capacitor C2 is connected to the ground. The output of the operational amplifier OP11 is input to a positive input terminal of an operational amplifier OP12, in which gm=gm2. The output of the operational amplifier OP12 is fed back to a negative input terminal of the operational amplifier OP12. The output of the operational amplifier OP12 is connected to the output of the capacitor C1, and this connection point constitutes the output of the band-pass filter 30 or 32.

In this circuit, the capacitor C1 functions as a high-pass filter and the capacitor C2 functions as a low-pass filter. Therefore, by means of setting the specifications, such as the capacitances of the capacitors C1 and C2 and the gm values of the operational amplifiers OP11 and OP12, various parameters of the band-pass filter can be set, such as the transmission bandwidth and the transmission center frequency F0.

This circuit has a circuit for adjusting gm values of the operational amplifiers OP11 and OP12. That is, transistors Q41 and Q42 are respectively connected to the operational amplifiers OP11 and OP12, and allow flow of currents which determine the gm values of the operational amplifiers OP11 and OP12. The transistors Q41 and Q42 are NPN-type transistors, and each has a collector connected to the operational amplifier OP11 or OP12, an emitter connected to the ground, and a base connected to a base of an input side transistor Q43 of a current mirror. The transistor Q43 is a transistor for allowing flow of an adjustment current, and has a collector connected to a zapping circuit, which serves as a current source of the adjustment current, and an emitter connected to the ground. The collector and the emitter of the transistor Q43 are mutually connected via a connection transistor Q44. The transistor Q44 is of NPN type, and has a base connected to the collector of the transistor Q43, a collector connected to a power supply, and an emitter connected to the base of the transistor Q43. The connection transistor Q44 connects (or short-circuits) the collector and base of the transistor Q43.

With this circuit, a current which is substantially identical with the current flowing through the transistor Q43 flows through the transistors Q41 and Q42. Adjustment of the magnitude of the adjustment current flowing through the transistor Q43 enables adjustment of the gm values of the operational amplifiers OP11 and OP12 and adjustment of the center frequency of the band-passfilter.

In the embodiment, a zapping circuit is used as the circuit for generating the adjustment current, and can adjust the magnitude of the adjustment current through zapping. The zapping circuit employed in the embodiment will now be described.

In the present specification, the words "zapping diode" mean "Zener diode for use of zapping". A resistance of a zapping diode (=Zener diode) becomes 0 by zapping and function of the Zener diode will not be recovered.

Figure 3:
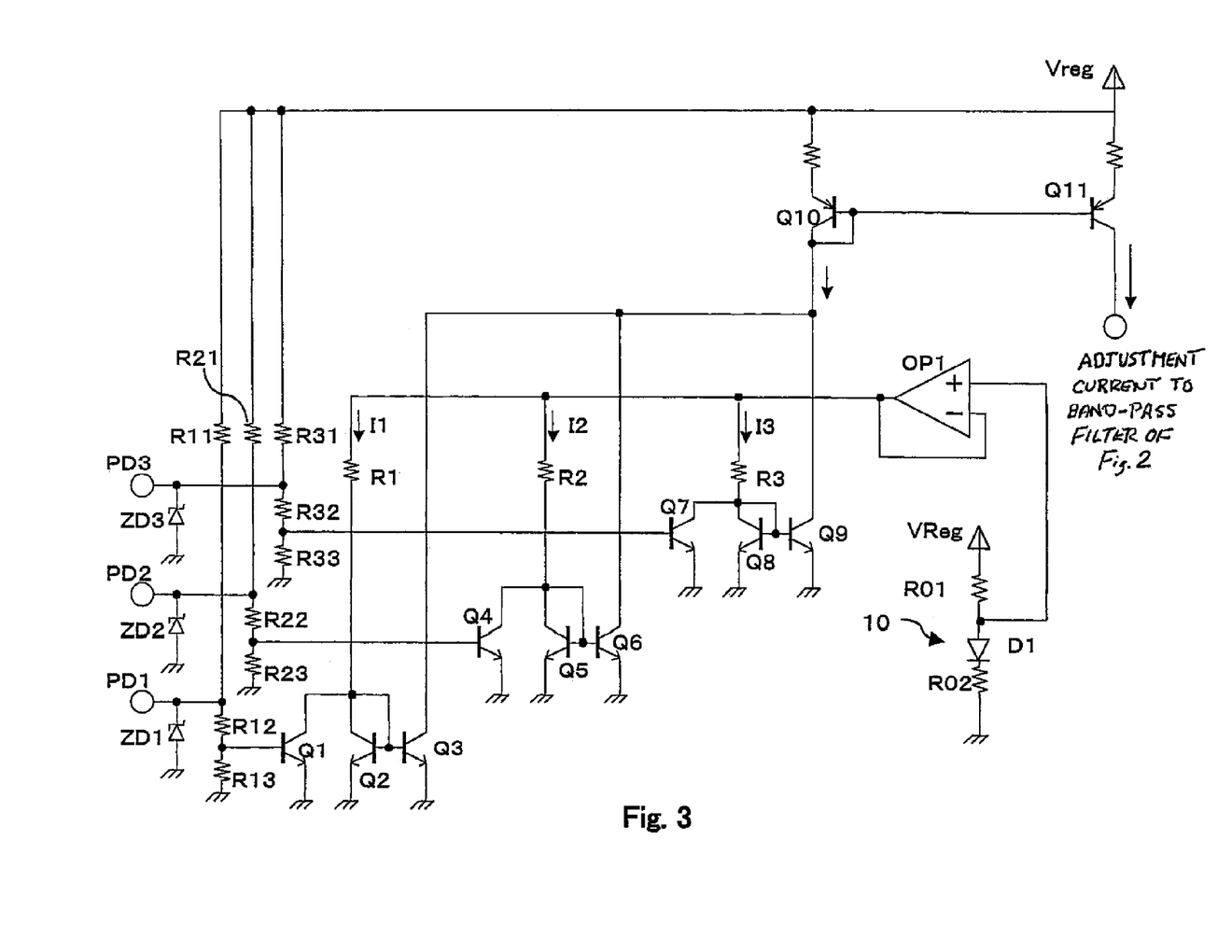
FIG. 3 is a diagram showing an example of a zapping circuit.

FIG. 3 is a diagram showing a zapping circuit employed in the present embodiment. A reference power supply 10 is a circuit which outputs a reference voltage. In the illustrated configuration, the reference power supply 10 comprises a serially connected structure consisting of a resistor R01, a diode D1, and a resistor R02, arranged between a predetermined power supply Vreg and the ground. A voltage at the upper side (anode side) of the diode D1 is determined from the voltage of the power supply Vreg, a voltage drop at the diode D1 (1Vbe), and resistance values of the resistors R01 and R02. The thus-determined anode-side voltage is output as a reference voltage. Therefore, the temperature characteristics of 1Vbe at the diode D1 are imparted to the reference voltage.

The reference voltage is input to a positive input terminal of an operational amplifier OP1. The operational amplifier OP1 is a buffer amplifier in which an output terminal is connected (or short-circuited) to a negative input terminal. Therefore, a reference voltage is stably output on the output terminal of the operational amplifier OP1.

Collectors of two-NPN type transistors Q1 and Q2 each having an emitter connected to the ground are connected to the output of the operational amplifier OP1 via a resistor R1. A base and a collector of the transistor Q2 are connected (via diode connection) to each other, and a base of an NPN-type transistor Q3 having an emitter connected to the ground is connected to the base of the transistor Q2. Therefore, the transistors Q2 and Q3 form a current mirror. An adjustment current I1 having a magnitude of a voltage which is reduced by 1Vbe from the reference voltage divided by the resistance value of the resistor R1 flows through the transistor Q2, and a current having the same magnitude flows through the transistor Q3.

In the illustrated structure, two circuits having the same structure as the circuit comprising the resistor R1 and the transistors Q1, Q2, and Q3 are additionally provided on the output of the operational amplifier OP1. That is, a circuit comprising a resistor R2 and transistors Q4, Q5, and Q6 and a circuit comprising a resistor R3 and transistors Q7, Q8, and Q9 are provided. Similar to the case of the first circuit, an adjustment current I2 which is determined by the resistor R2 flows through the transistor Q6, and an adjustment current I3 which is determined by the resistor R3 flows through the transistor Q9.

The collectors of the transistors Q3, Q6, and Q9 are commonly connected to a collector of a PNP-type transistor Q10, which has an emitter connected to the power supply Vreg via a resistance, and a base and a collector which are connected to each other. Therefore, a current which is obtained by adding the adjustment currents flowing through the transistors Q3, Q6, and Q9 flows through the transistor Q10. A base of a PNP-type transistor Q11 which has an emitter connected to the power supply Vreg via a resistor is connected to a base of the transistor Q10. A collector of the transistor Q11 constitutes a current output terminal.

Thus, the transistors Q10 and Q11 form a current mirror, and a reference current identical with a reference current flowing through the reference transistor, transistor Q10, flows through the transistor Q11 and is output. By means of providing a plurality of transistors which form current mirrors and are connected to the transistor Q10, reference currents can be output from these transistors also. By means of changing the area of the emitter of the output transistor, the magnitude of the current to be output can be changed to various different values.

A connection point between resistors R12 and R13 among three serially connected resistors R11, R12, and R13 connected between the power supply Vreg and the ground is connected to the base of the transistor Q1. The resistance values of the resistors R11, R12, and R13 are set so that the voltage of the connection point between the resistors R12 and R13 is sufficient to enable activation of the transistor Q1. In addition, a cathode of a zapping diode ZD1 having an anode connected to the ground, and a zapping terminal PD1 are connected to a connection point between the resistors R11 and R12 among the serially connected resistors R11, R12, and R13.

Similarly, circuits identical with that connected to the base of the transistor Q1 are respectively connected to the bases of the transistors Q4 and Q7. That is, a resistance divider circuit comprising resistors R21, R22, and R23, and a zapping diode ZD2 and a zapping terminal PD2 which are connected to the resistance divider circuit are connected to the base of the transistor Q4, and a resistance divider circuit comprising resistors R31, R32, and R33, and a zapping diode ZD3 and a zapping terminal PD3 which are connected to the resistance divider circuit are connected to the base of the transistor Q7.

Before zapping by the zapping terminals PD1, PD2, and PD3 occurs, the zapping diodes (Zener diodes) ZD1, ZD2, and ZD3 are functioning and the voltage on the cathode side is maintained. Thus, transistors Q1, Q4, and Q7 are in an ON state. These transistors Q1, Q4, and Q7 are configured such that when these transistors are ON, current flows through these transistors in place of the transistors Q2, Q5, and Q8, and no current flows through the transistors Q2, Q5, and Q8. Therefore, no current flows through the transistors Q2, Q3, Q5, Q6, Q8, and Q9, and adjustment current becomes I1=I2=I3=0. Thus, the sum of the adjustment current is 0 and no current flows through the transistors Q10 and Q11. Therefore, the output current from the zapping circuit is 0.

In this circuit, by means of individually applying, to the zapping terminals PD1, PD2, and PD3, a voltage which is sufficient to induce destructive breakdown (break) of the zapping diodes ZD1, ZD2, and ZD3, break of the zapping diodes ZD1, ZD2, and ZD3 can be induced independently. When the zapping diode ZD1, ZD2, or ZD3 is broken, the zapping terminal PD1, PD2, or PD3 is connected to the ground.

For example, when a predetermined voltage is applied to the zapping terminal PD1 to induce break of the zapping diode ZD1, the base of the transistor Q1 is connected to the ground and the transistor Q1 is switched off. When the transistor Q1 is switched off, adjustment current I1 flows through the transistor Q2, consequently causing the adjustment current I1 to flow through the transistors Q3, Q10, and Q11.

Similarly, when zapping is performed by the zapping terminal PD2, the adjustment current I2 flows through the transistors Q5, Q6, Q10, and Q11, and when zapping is performed by the zapping terminal PD3, the adjustment current I3 flows through the transistors Q8, Q9, Q10, and Q11. Therefore, through zapping, the current in the transistor Q11 can be set to 8 different values; 0, I1, I2, I3, I1+I2, I2+I3, I3+I1, and I1+I2+I3. By setting, for example, the adjustment currents I1, I2, and I3 at a ratio of 1:2:4, 8 different currents from 0 to 7 can be obtained.

By means of changing an emitter area ratio in each of pairs of transistors (Q1, Q2), (Q4, Q5), and (Q7, Q8) forming a current mirror, the adjustment currents I1, I2, and I3 can be changed independently. In addition, by means of changing the resistance values of the resistors R1, R2, and R3, the adjustment currents I1, I2, and I3 can be changed independently.

In this configuration, when the transistor Q1, Q4, or Q7 is ON, no corresponding adjustment current flows. Therefore, the adjustment current can be set without consideration of the ON-resistance of these transistors Q1, Q4, and Q7. On the other hand, when the transistor Q1, Q4, or Q7 is OFF, current flows through the transistor Q2, Q5, or Q8. However, as described above, in each of the transistors Q2, Q5, and Q8, the collector and base are mutually connected, and, thus, the voltage drop is constant at 1vbe. Therefore, when zapping is performed the adjustment currents I1, I2, and I3 depend respectively on the resistors R1, R2, and R3, but do not depend on the ON-resistances of the transistors Q2, Q5, and Q8. Therefore, the adjustment currents I1, I2, and I3 are less significantly affected by variations in the transistors. In addition, although the adjustment currents I1, I2, and I3 are affected respectively by the temperature characteristics of Vbe of the transistors Q1, Q4, and Q7, the reference voltage from the reference power supply 10 is also affected by the temperature characteristics of Vbe of the diode D1, in such a manner that the temperature characteristics are cancelled out. Therefore, the present embodiment provides an advantage in that the adjustment currents I1, I2, and I3 are basically unaffected by the temperature characteristics of transistors.

Figure 4:
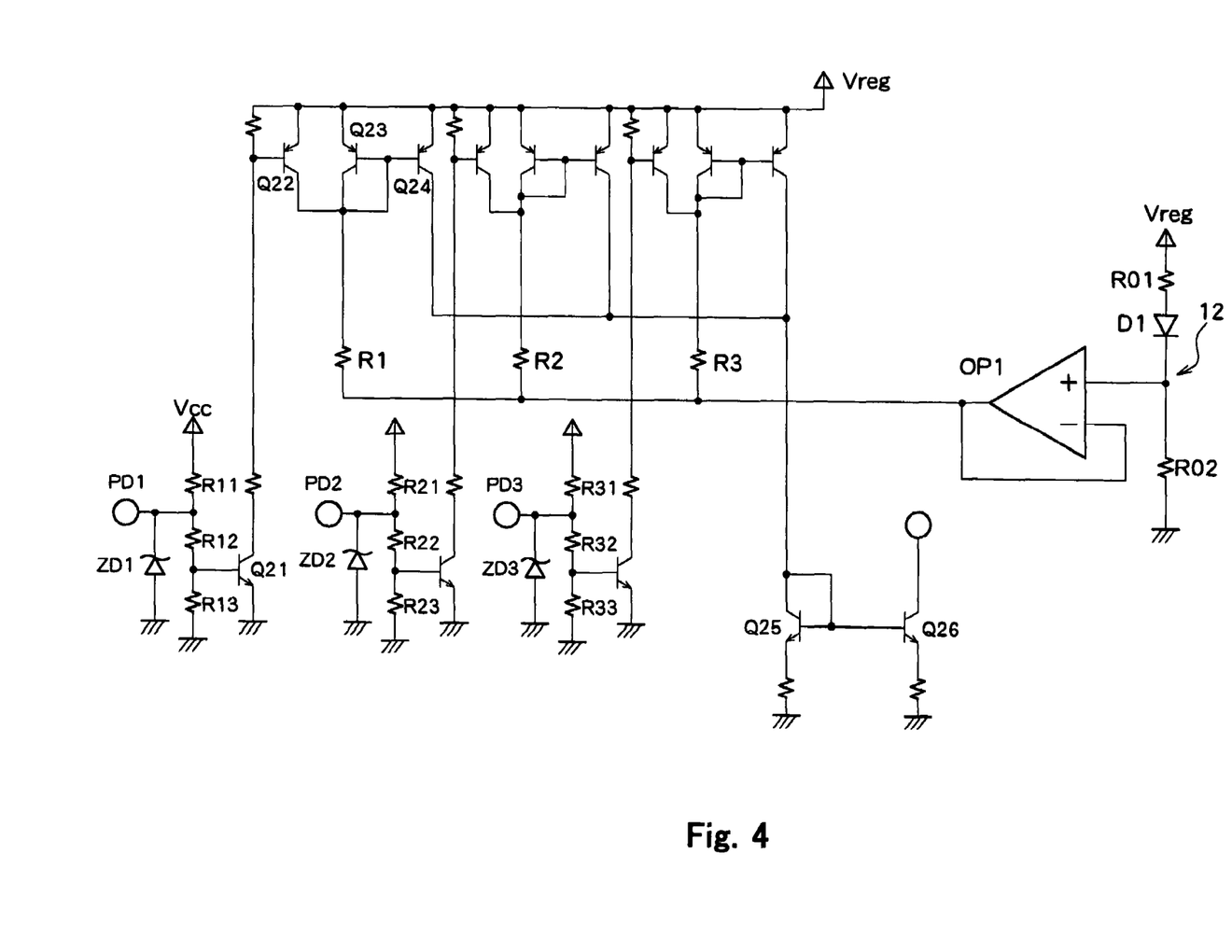
FIG. 4 is a diagram showing another example of a zapping circuit.

In the above-described structure, the transistors for adjustment current, Q2, Q3, Q5, Q6, Q8, and Q9 are described as being NPN transistors. However, PNP transistors may be employed in place of the NPN transistors. FIG. 4 shows an example circuit structure for this case.

The arrangements of zapping terminals PD1, PD2, and PD3, zapping diodes ZD1, ZD2, and ZD3 connected to the zapping terminals, and resistors R11, R12, R13, R21, R22, R23, R31, R32, and R33 are identical with those in the above-described case. The circuits for switching on and off three adjustment currents are identical with each other, and thus, only one of these circuits will be described.

A connection point between the resistors R12 and R13 is connected to a base of an NPN-type transistor Q21. An emitter of the transistor Q21 is connected to the ground, and a collector of the transistor Q21 is connected to a power supply Vreg via two resistors. A connection point between the two resistors is connected to a base of a PNP-type transistor Q22. An emitter of the transistor Q22 is connected to the power supply Vreg, and a collector of the transistor Q22 is connected to a collector of a PNP-type transistor Q23, which has an emitter connected to the power supply Vreg. The collector and a base of the transistor Q23 are connected to each other, and the base of the transistor Q23 is connected to a base of a transistor Q24. An emitter of the transistor Q24 is connected to the power supply Vreg, and the transistors Q23 and Q24 form a current mirror.

An output of an operational amplifier OP1 having its output terminal and its negative input terminal mutually connected is connected to the collectors of the transistors Q22 and Q23 via a resistor R1. A reference power supply 12 is connected to a positive input terminal of the operational amplifier OP1. The reference power supply 12 is similar to the reference power supply 10, in that the reference power supply 12 comprises a serial connection consisting of a resistor R01, a diode D1, and a resistor R02 between the power supply Vreg and the ground. The reference power supply 12 differs from the reference power supply 10 in that the cathode (lower side) of the diode D1 is connected to the positive input terminal of the operational amplifier OP1.

A collector of the transistor Q24 is connected to a collector of an NPN-type transistor Q25, which has its emitter connected to the ground and its collector and base connected to each other. A base of a transistor Q26 having its emitter connected to the ground is connected to the base of the transistor Q25.

As illustrated in FIG. 4 resistors are preferably inserted between emitters of transistors Q25 and Q26 and the ground.

Therefore, when zapping is not performed, the transistor Q21 is switched on and the transistor Q22 is switched on, which causes the transistors Q23 and Q24 to be switched off, resulting in no flow of adjustment current. When, on the other hand, zapping is performed, the transistor Q21 is switched off and the transistor Q22 is switched off, which causes the transistors Q23 and Q24 to be switched on, and the adjustment current to flow. In this structure also, when the transistor Q23 is ON, Vce is fixed to Vce=Vbe, and thus, this circuit is not affected by the ON-resistance of the transistor Q23. The temperature characteristics of the transistor Q22 are compensated by the temperature characteristics of the diode D1.

In this manner, in this circuit, adjustment current having a stable current value can be adjusted. By use of the current adjusted by zapping, the center frequency in a band-pass filter can be suitably adjusted.

What is claimed is:

1. A band-pass filter for extracting a signal of a certain frequency, comprising:
    a high-pass capacitor provided along a route of an input signal;
    a low-pass capacitor provided between the transmission route of the input signal and the ground; and
    an operational amplifier for amplifying a signal which is subjected to processing by at least one of the high-pass capacitor and the low-pass capacitor, wherein
    a filtering characteristic of the band-pass filter can be adjusted by means of changing a gm value of the operational amplifier, and
    a current for adjusting the gm value of the operational amplifier can be set through zapping by use of a zapping circuit.

2. The band-pass filter according to claim 1, wherein
    the operational amplifier comprises a first operational amplifier and a second operational amplifier;
    the first operational amplifier amplifies a signal obtained on an output side of the high-pass capacitor;
    the low-pass capacitor is provided between an output of the first operational amplifier and the ground;
    the second operational amplifier amplifies a signal which is subjected to processing by the low-pass capacitor, and
    an output of the second operational amplifier is connected to an output side of the high-pass capacitor, which constitutes a signal output.

3. The band-pass filter according to claim 1, wherein
    the zapping circuit comprises:
    a reference transistor for inducing flow of a reference current for determining an amount of current of a constant current source;
    an adjustment current transistor for inducing flow of an adjustment current which constitutes at least a portion of the reference current flowing through the reference transistor;
    a current-determining transistor, which forms a current mirror in combination with the adjustment current transistor, for determining a magnitude of the adjustment current flowing through the adjustment current transistor, the current-determining transistor being diode-connected; and
    a switching transistor which is connected in parallel with the current-determining transistor, current flowing through the switching transistor and not through the current-determining transistor when the switching transistor is switched on and current flowing through the current-determining transistor when the switching transistor is switched off, wherein
    the switching transistor is set to be on or off through a zapping operation with respect to a zapping terminal, and
    an amount of reference current is adjusted by the on/off state of the switching transistor.

4. The band-pass filter according to claim 3, wherein
    a zapping diode is connected to the zapping terminal, and
    the zapping diode is broken by a zapping operation in which a predetermined high voltage is applied to the zapping terminal.

5. The band-pass filter according to claim 4, wherein
    voltage divider resistors are connected to the zapping terminal and the on/off state of the switching transistor is controlled by a voltage at an intermediate point of the voltage divider resistors.

6. The band-pass filter according to claim 3, wherein
    a reference voltage is applied to the current-determining transistor via a resistor.

7. The band-pass filter according to claim 6, wherein
    the reference voltage is generated from a reference power supply, and the reference power supply includes a compensation transistor which is diode-connected.

8. The band-pass filter according to claim 7, wherein
    the compensation transistor in the reference power supply is inserted at an intermediate point of voltage divider resistors, and
    the temperature characteristics of the current determining transistor are compensated by a voltage change of the reference voltage arising from temperature characteristics of the compensation transistor.

9. A tracking signal processor circuit for obtaining a tracking signal for tracking of a video track from a read signal obtained by a video head, the circuit comprising:
    a pair of band-pass filters for extracting pilot signals of two different specific frequencies, and
    a comparator for comparing output levels of the pair of band-pass filters to output the tracking signal, wherein
    each of the pair of band-pass filters comprises:
    a high-pass capacitor provided along a route of an input signal;
    a low-pass capacitor provided between a transmission route of the input signal and a ground; and
    an operational amplifier for amplifying a signal which is subjected to processing by at least one of the high-pass capacitor and the low-pass capacitor, wherein
    a filtering characteristic of the band-pass filter can be adjusted by means of changing a gm value of the operational amplifier, and
    a current for adjusting the gm value of the operational amplifier can be set through zapping by use of a zapping circuit.

10. The tracking signal processor circuit according to claim 9, wherein
    the operational amplifier comprises a first operational amplifier and a second operational amplifier;
    the first operational amplifier amplifies a signal obtained on an output side of the high-pass capacitor;
    the low-pass capacitor is provided between an output of the first operational amplifier and the ground;
    the second operational amplifier amplifies a signal which is subjected to processing by the low-pass capacitor, and
    an output of the second operational amplifier is connected to an output side of the high-pass capacitor, which constitutes a signal output.

11. The tracking signal processor circuit according to claim 9, wherein the zapping circuit comprises:
a reference transistor for inducing flow of a reference current for determining an amount of current of a constant current source;
an adjustment current transistor for inducing flow of an adjustment current which constitutes at Least a portion of the reference current flowing through the reference transistor;
a current-determining transistor, which forms a current mirror in combination with the adjustment current transistor, for determining a magnitude of the adjustment current flowing through the adjustment current transistor, the current-determining transistor being diode-connected; and
a switching transistor which is connected in parallel with the current-determining transistor, current flowing through the switching transistor and not through the current-determining transistor when the switching transistor is switched on and current flowing through the current-determining transistor when the switching transistor is switched oft wherein
the switching transistor is set to be on or off through a zapping operation with respect to a zapping terminal, and
an amount of reference current is adjusted by the on/off state of the switching transistor.

12. The tracking signal processor circuit according to claim 11, wherein
a zapping diode is connected to the zapping terminal, and the zapping diode is broken by a zapping operation in which a predetermined high voltage is applied to the zapping terminal.

13. The tracking signal processor circuit according to claim 12, wherein
voltage divider resistors are connected to the zapping terminal and the on/off state of the switching transistor is controlled by a voltage at an intermediate point of the voltage divider resistors.

14. The tracking signal processor circuit according to claim 11, wherein
a reference voltage is applied to the current-determining transistor via a resistor.

15. The tracking signal processor circuit according to claim 14, wherein
the reference voltage is generated from a reference power supply, and the reference power supply includes a compensation transistor which is diode-connected.

16. The tracking signal processor circuit according to claim 15, wherein
the compensation transistor in the reference power supply is inserted at an intermediate point of voltage divider resistors, and
the temperature characteristics of the current-determining transistor are compensated by a voltage change of the reference voltage arising from temperature characteristics of the compensation transistor.

* * * * *